(12) United States Patent
Tsujiya et al.

(10) Patent No.: US 10,785,882 B2
(45) Date of Patent: Sep. 22, 2020

(54) ELECTRICAL JUNCTION BOX

(71) Applicant: Sumitomo Wiring Systems, Ltd., Yokkaichi, Mie (JP)

(72) Inventors: Yoshinao Tsujiya, Mie (JP); Masatomo Inoue, Mie (JP); Hiroshi Wakabayashi, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 16/434,358

(22) Filed: Jun. 7, 2019

(65) Prior Publication Data
US 2019/0380215 A1    Dec. 12, 2019

(30) Foreign Application Priority Data

Jun. 8, 2018   (JP) ................................. 2018-109970

(51) Int. Cl.
*H05K 5/00*       (2006.01)

(52) U.S. Cl.
CPC ......... *H05K 5/0056* (2013.01); *H05K 5/0052* (2013.01); *H05K 5/0069* (2013.01)

(58) Field of Classification Search
CPC .. H05K 5/0056; H05K 5/0052; H05K 5/0069; H05K 5/0026; H05K 5/0039; H05K 5/0043; H05K 5/0269; H05K 5/00
USPC .............................................. 439/377, 76.1
See application file for complete search history.

(56) References Cited

U.S. PATENT DOCUMENTS

| | | | | |
|---|---|---|---|---|
| 4,368,394 A * | 1/1983 | Naimer | ................ | H01H 71/123 307/115 |
| 5,510,957 A * | 4/1996 | Takagi | ................... | H04B 1/082 361/814 |
| 6,705,878 B2 * | 3/2004 | Liang | ................... | H01R 31/065 361/752 |
| 7,149,089 B2 * | 12/2006 | Blasko | ................ | H01R 13/521 361/752 |
| 7,331,801 B1 * | 2/2008 | Eichorn | ............... | H01R 12/724 439/76.1 |
| 7,359,208 B2 * | 4/2008 | Ni | ........................ | H05K 5/0278 361/752 |
| 7,413,463 B2 * | 8/2008 | Matsuo | ............... | H05K 5/0039 439/377 |
| 7,452,234 B2 * | 11/2008 | Ma | ..................... | H01R 13/6582 439/382 |
| 8,545,238 B2 * | 10/2013 | Takeda | ................. | H01R 12/724 439/377 |
| 9,326,395 B2 * | 4/2016 | Kanou | ................ | H05K 5/0069 |
| 2001/0003074 A1 * | 6/2001 | Johnson | ............. | H01R 12/7005 439/377 |

(Continued)

*Primary Examiner* — Harshad C Patel
(74) *Attorney, Agent, or Firm* — Honigman LLP

(57) ABSTRACT

An electrical junction box is provided that can suppress a failure occurring due to a connector being exposed to external stress. An electrical junction box includes a substrate on which the connector is mounted, a case in which an opening portion is formed and the substrate is accommodated, and a cover that is attached to the opening portion and in which an insertion hole, into which the connector is to be inserted, is formed in a penetrating manner. The cover includes protruding portions at positions on sides of the connector, the protruding portions protruding forward of a leading end of the connector.

4 Claims, 8 Drawing Sheets

(56) References Cited

U.S. PATENT DOCUMENTS

2015/0132977 A1 5/2015 Kanou et al.
2018/0228047 A1* 8/2018 Ota .......................... H02G 3/16

* cited by examiner

ELECTRICAL JUNCTION BOX

CROSS-REFERENCE TO RELATED APPLICATIONS

This application claims priority of Japanese Patent Application No. JP 2018-109970 filed on Jun. 8, 2018, the contents of which are incorporated herein.

TECHNICAL FIELD

The present specification discloses technology related to an electrical junction box.

BACKGROUND

Electrical junction boxes that include a connector capable of being connected to an external device are conventionally known. The electrical junction box in JP 2015-95930A includes a case that has an opening portion and a cover that is attached to the opening portion of the case, and a connector protrudes outward from a through-hole formed in the cover. A printed board with a connector mounted on a surface thereof is accommodated within the case, and a terminal of the connector is soldered to the printed board.

SUMMARY

In the case of a configuration in which the connector of an electrical junction box protrudes from the through-hole in the cover, the connector is likely to be subjected to external stress. For this reason, the external stress affects the terminal of the connector that is soldered to a substrate, and there is a concern that a failure, such as a connection failure between the substrate and the terminal, will occur. When transporting an electrical junction box, it is preferable to transport the electrical junction box with the connector located downward to prevent dust or the like from entering the connector. In this case, however, there is a concern that the connector will be affected by vibrations when the electrical junction box is transported.

The technology described in the present specification has been completed based on the foregoing situation, and aims to provide an electrical junction box capable of keeping a failure from occurring due to a connector being subjected to external stress.

The electrical junction box described in the present specification includes: a substrate with a connector attached thereto; a case in which an opening portion is formed and the substrate is accommodated; and a cover that is attached to the opening portion, and in which an insertion hole, into which the connector is inserted, is formed in a penetrating manner, wherein the cover includes protruding portions at positions on two sides of the connector, the protruding portions protruding forward of a leading end of the connector.

According to this configuration, the cover includes the protruding portions that protrude forward of the leading end of the connector, at positions on two sides of the connector. These protrusions make it possible to suppress the influence of external stress on the connector. Accordingly, a failure can be kept from occurring due to the connector being subjected to external stress.

The following modes are preferable as embodiments of the technique described in the present specification.

A hole edge of the insertion hole has a pair of short portions that oppose each other, and a pair of long portions that are longer than the short portions and oppose each other, and each of the protruding portions is provided on a short portion side.

This configuration makes it possible to keep the protruding portions from obstructing fitting to a counterpart connector, compared with a configuration in which each of the protruding portions is provided on a long portion side.

The cover includes a locked portion that is locked to the case when the cover is attached to the case, in which substrate is accommodated, in a direction in which the connector is inserted into the insertion hole, and each of the protruding portions includes a wall portion extending along the hole edge of the insertion hole, and a rib extending in a direction intersecting a direction in which the wall portion extends.

This configuration makes it possible to increase the area of the protruding portions, which are to be pressed by an operator when fitting the cover to the case, by an amount corresponding to the size of the ribs, and thus, operability can be increased when attaching the cover to the case.

The rib has an extending portion extending in a direction parallel to the short portions.

This configuration makes it possible to increase the area of the protruding portion on each short portion side, on which the area where the protrusions can be provided is small, and thus, operability can be increased when attaching the cover.

The cover is provided with a reinforcing wall along each of the long portions, and the reinforcing wall has a height that that keeps the reinforcing wall from protruding forward of the leading end of the connector.

This configuration makes it possible to keep the reinforcing wall from obstructing fitting to a counterpart connector while reinforcing the long portion sides of the cover by making the height of the reinforcing walls smaller than the height of the connector on the long portion sides of the cover.

The technique described in the present specification can suppress a failure occurring due to the connector receiving stress from the outside.

DETAILED DESCRIPTION OF PREFERRED EMBODIMENTS

The present embodiment will be described with reference to FIGS. 1 to 8. An electrical junction box 10 is arranged, for example, in a power supply path between a power source, such as a vehicle battery in an electric vehicle, a hybrid vehicle, or the like, and a load, which is a lamp, a motor, or the like. Although the electrical junction box 10 can be arranged in any direction, in the following description, the X direction, the Y direction, and the Z direction in FIG. 1 indicate the front side, the left side, and the upper side, respectively.

Figure 5:
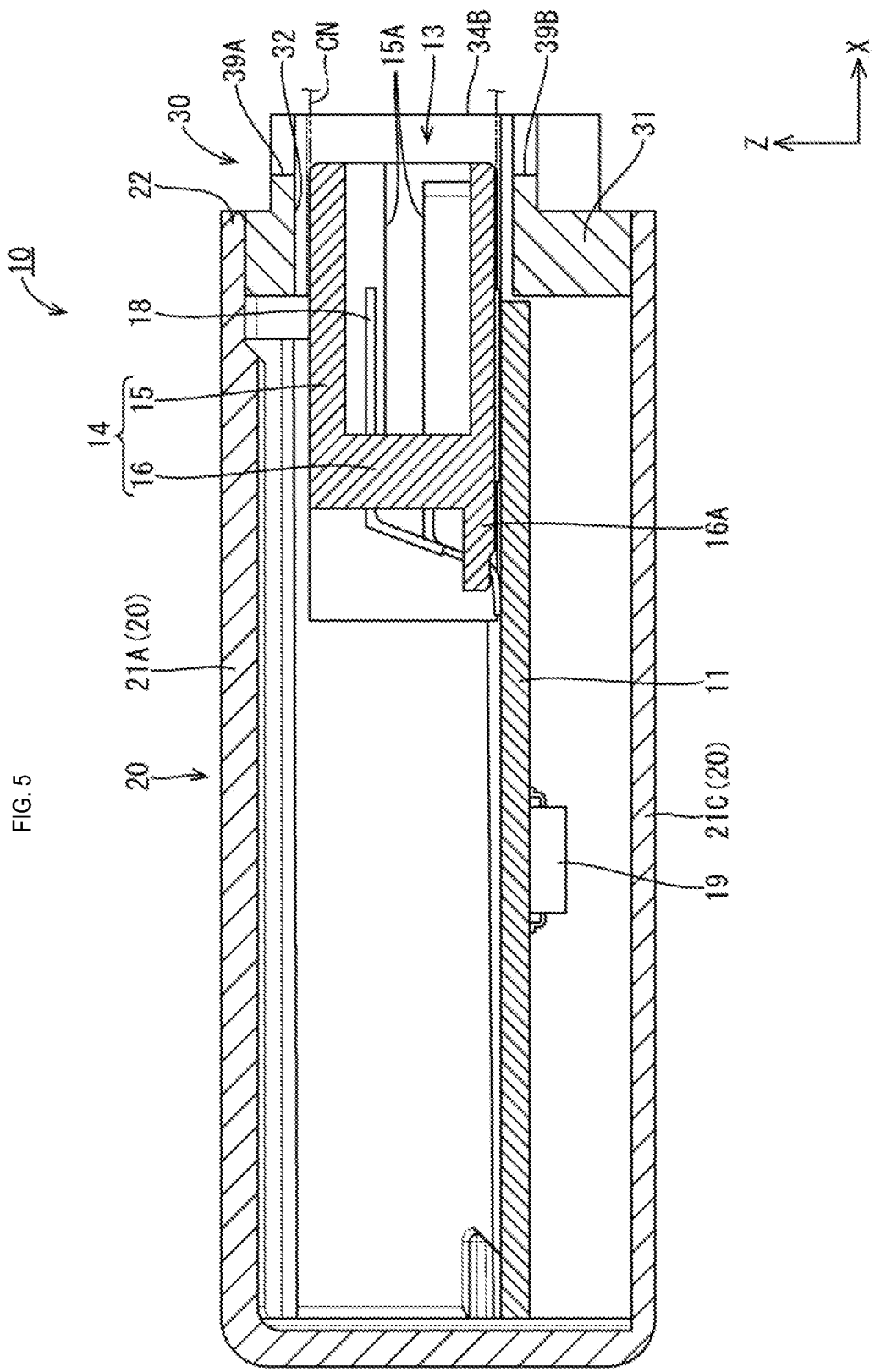
FIG. 5 is a cross-sectional view of FIG. 3 taken along a line B-B.

As shown in FIG. 5, the electrical junction box 10 includes a substrate 11, to which a connector 13 is attached, a case 20, in which the substrate 11 is accommodated, and a cover 30, which is to be attached to the case 20. For example, the substrate 11, which has a rectangular shape, is a printed board on which a conductive path, which is made of copper foil or the like, is formed on an insulating plate by means of a printed wiring technique, and an electronic component 19 is mounted on a lower face of the substrate 11. The electronic component 19 may be, for example, an FET (Field Effect Transistor), a coil, a capacitor, an IC (Integrated Circuit), or the like. The connector 13 includes a housing 14, which is made of a synthetic resin, and a connector terminal 18. The housing 14 includes a hood portion 15, which has a rectangular-tubular shape and to which a counterpart connector CN can be fitted, and a terminal fixing portion 16, which is continuous with the rear side of the hood portion 15 and fixes the connector terminal 18. A protrusion 15A, which can guide the counterpart connector CN in a fitting direction, extends in the front-rear direction (fitting direction) on an inner wall of the hood portion 15. A support portion 16A, which has a plate shape and supports a portion of the connector terminal 18 on the substrate 11 side, extends rearward in a lower portion of the terminal fixing portion 16.

The connector terminal 18 is a bar-shaped portion that is made of copper, a copper alloy, or the like, and is bent into a crank shape. One end portion of the connector terminal 18 protrudes into the hood portion 15 and is to be connected to a terminal of the counterpart connector CN, and the other end portion is soldered to a conductive path on a surface of the substrate 11. The connector 13 can be formed by means of, for example, insert molding by placing the connector terminal 18 within a mold and injecting resin into the mold, but this may not be the case. For example, the connector 13 may be formed by press-fitting the connector terminal to a press-fit hole in the housing.

Figure 6:
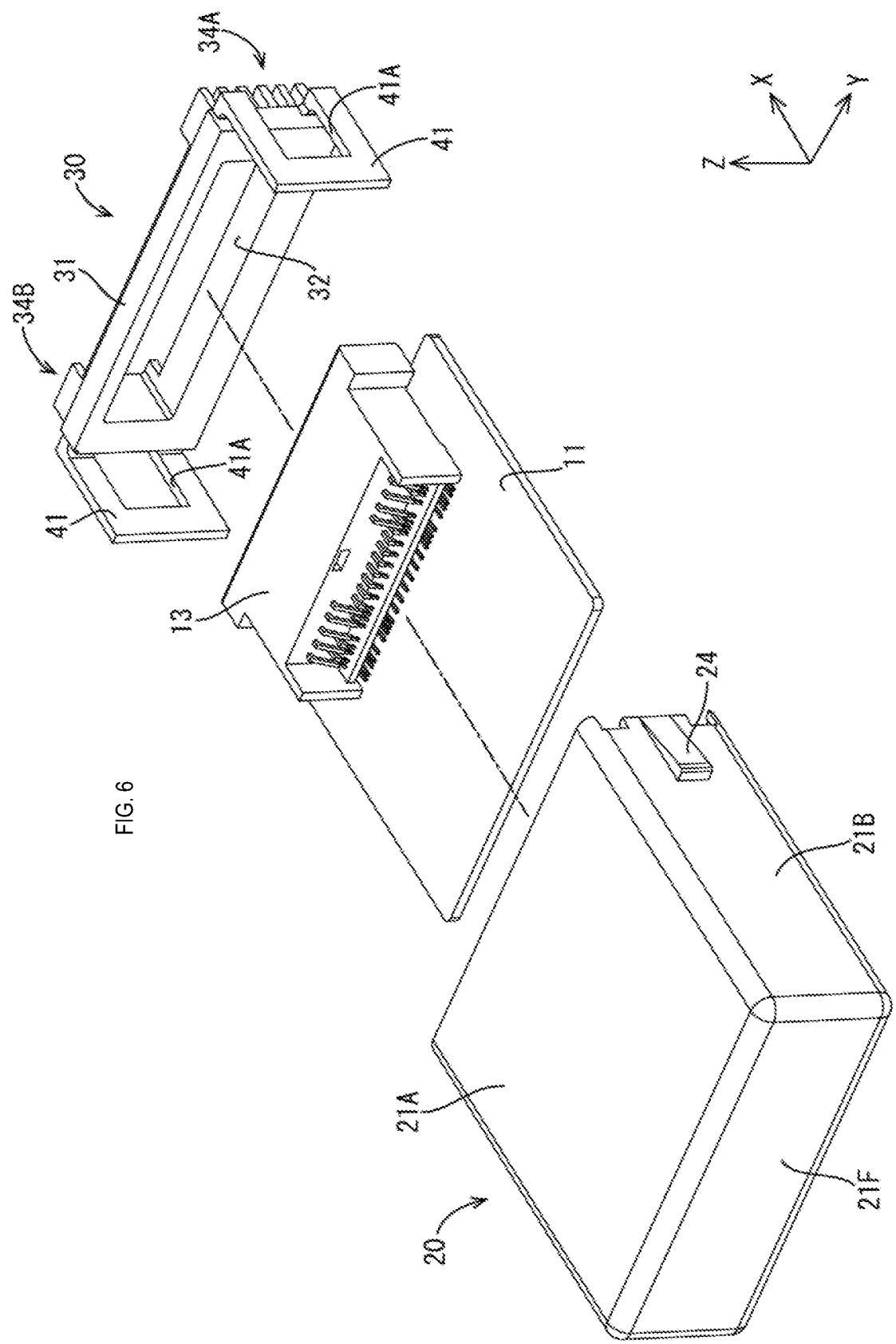
FIG. 6 is an exploded perspective view of the electrical junction box.
Figure 7:
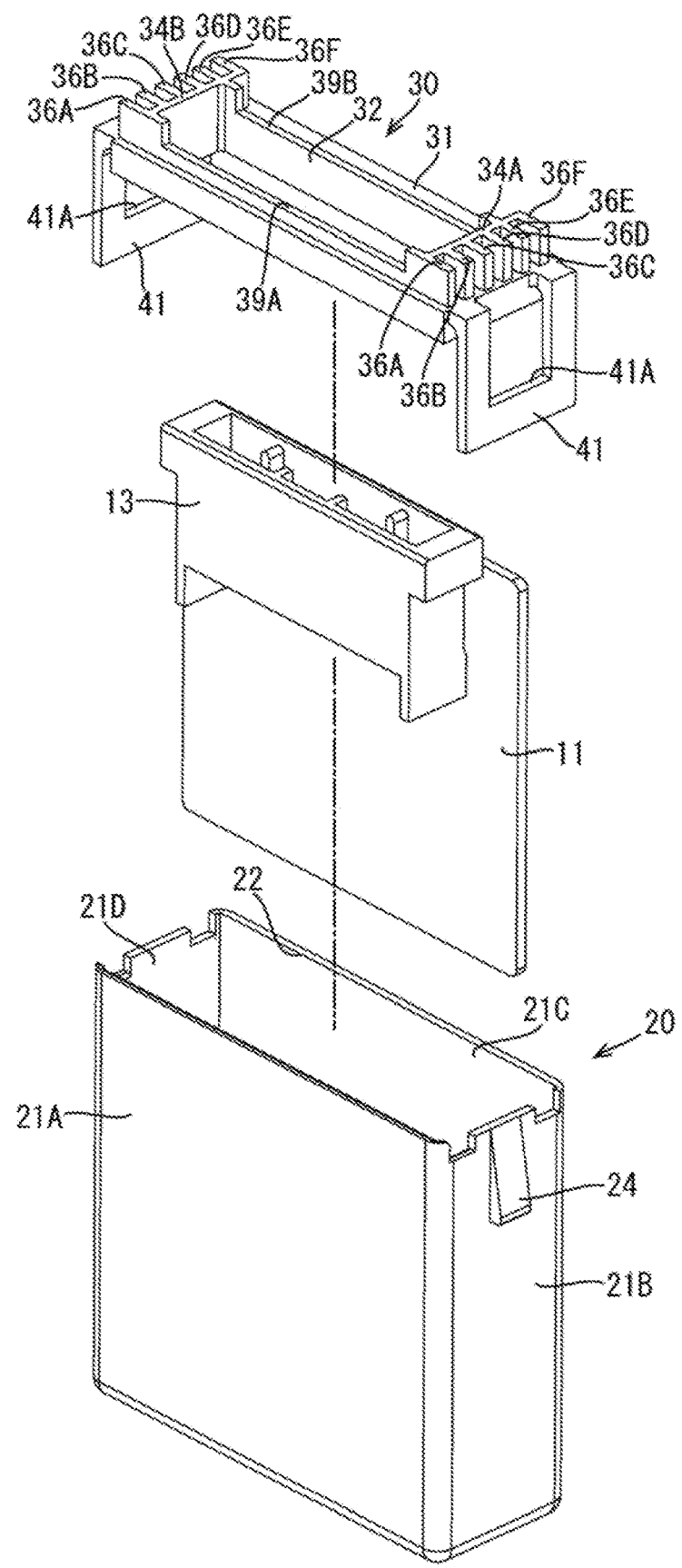
FIG. 7 illustrates a process of assembling the electrical junction box.

The case 20 is made of a synthetic resin, and has a flat, rectangular-tubular shape, as shown in FIGS. 6 and 7. The case 20 includes a pair of opposing walls 21A and 21C, and a pair of side walls 21B and 21D, which connect the pair of opposing walls 21A and 21C and have an area smaller than the area of the opposing walls 21A and 21C. An opening portion 22 is formed on the front side (one end side) of the case 20, and a closing wall 21F, which closes the case 20, is formed on the rear side (the other end side) of the case 20. The opening portion 22 has a rectangular shape such that the substrate 11 to which the connector 13 is attached can be inserted from the opening portion 22. Lock protruding portions 24 protrude outward at front end portions (end portions on the cover 30 side) of outer faces of the side walls 21B and 21D. The lock protruding portions 24 have a stepped shape that protrudes outward such that the protruding length decreases obliquely forward (i.e. toward the cover 30 side). Rectangular cutouts are made on both sides of the lock protruding portion 24 at the front end portion of each of the side walls 21B and 21D. As shown in FIG. 5, the substrate 11 is arranged within the case 20 in an orientation that makes the board faces parallel to the opposing walls 21A and 21C of the case 20.

The cover 30 is made of a synthetic resin, and includes a cover body 31, in which an insertion hole 32 is formed in a penetrating manner, and a pair of locked portions 41, which are provided at both end portions of the cover body 31 and are to engage with the pair of lock protruding portions 24 of the case 20, as shown in FIGS. 6 and 7. The cover body 31 has a flat plate shape for covering the opening portion 22 of the case 20. A pair of left and right protruding portions 34A and 34B, which protrude forward, and a pair of upper and lower reinforcing walls 39A and 39B, which connect the pair of protruding portions 34A and 34B, are provided so as to surround the insertion hole 32.

Figure 2:
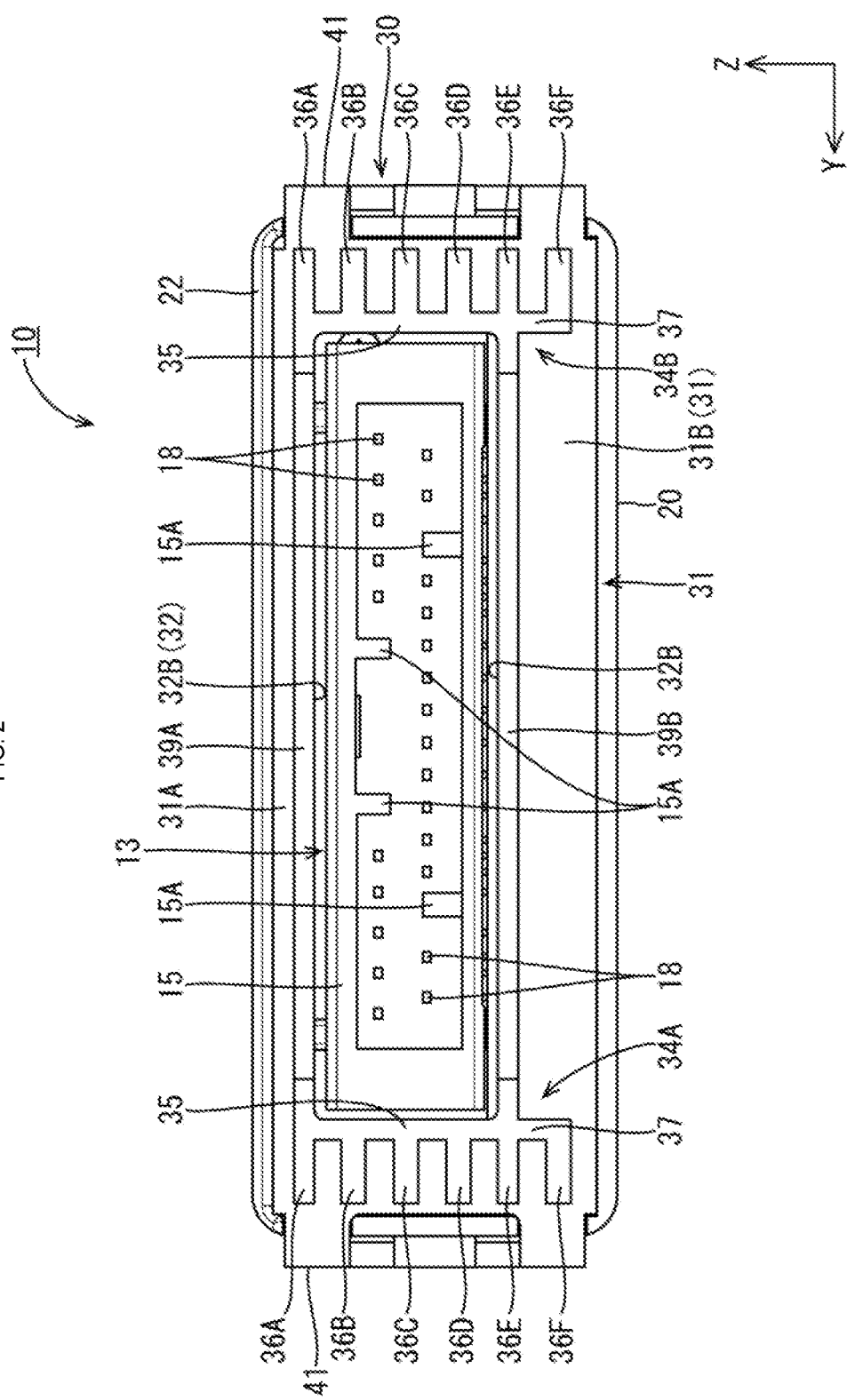
FIG. 2 is a front elevational view showing the electrical junction box.
Figure 3:
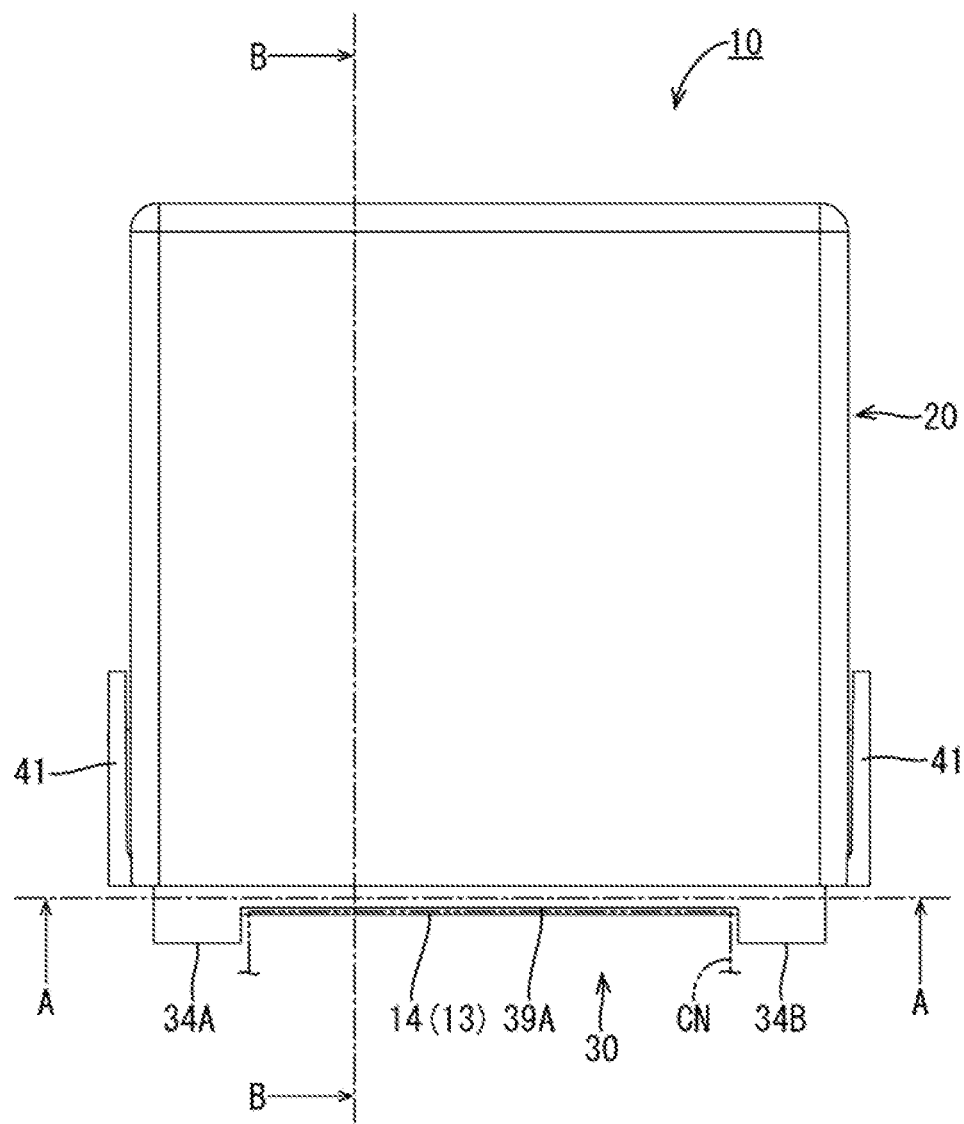
FIG. 3 is a plan view showing the electrical junction box.
Figure 3:
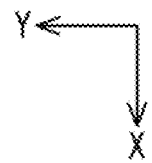
Figure 4:
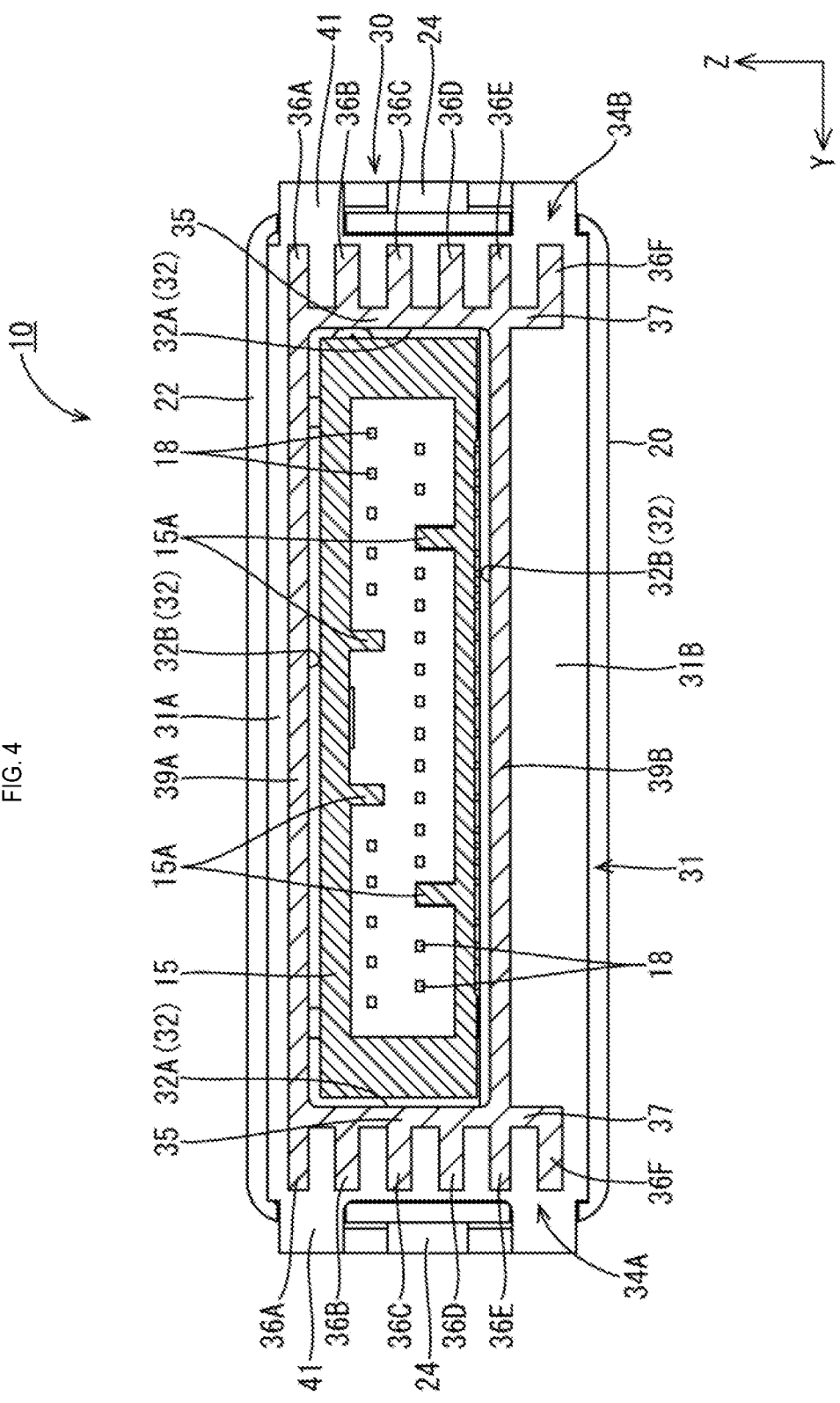
FIG. 4 is a cross-sectional view of FIG. 3 taken along a line A-A.

As shown in FIGS. 2 and 4, the insertion hole 32 has a rectangular shape, and has a pair of short portions 32A, which extend in the vertical direction and oppose each other, and a pair of long portions 32B, which extend in the left-right direction and oppose each other. The long portions 32A are longer than the short portions 32A.

The protruding portions 34A and 34B are formed to have an area that allows an operator to press the protruding portions 34A and 34B with a finger, and each include a wall portion 35, which extends along a hole edge of the insertion hole 32, and a plurality of ribs 36A to 36F, which protrude in a direction perpendicular to (i.e. intersecting) the direction in which the wall portion 35 extends. The wall portion 35 and the plurality of ribs 36A to 36F are formed such that leading end faces (front end faces) thereof are flush with each other (i.e. have the same height). The plurality of ribs 36A and 36F extend parallel to each other, and the lowermost rib 36F is provided on an extending portion 37, which extends in an L shape on the lower side of the wall portion 35.

The reinforcing walls 39A and 39B extend straight at respective fixed heights along the long portions 32B, and have a protruding length smaller than that of a leading end (front end) of the connector 13 (i.e. the leading ends of the reinforcing walls 39A and 39B are arranged rearward of the leading end of the connector 13), as shown in FIG. 5. A flat plate-shaped portion 31B of the cover 30 below the reinforcing wall 39B has a length in the up-down direction (and an area) that is larger than that of a flat plate-shaped portion 31A above the reinforcing wall 39A, and thus, an area that allows extension of the extending portions 37 of the protruding portions 34A and 34B is secured.

Figure 1:
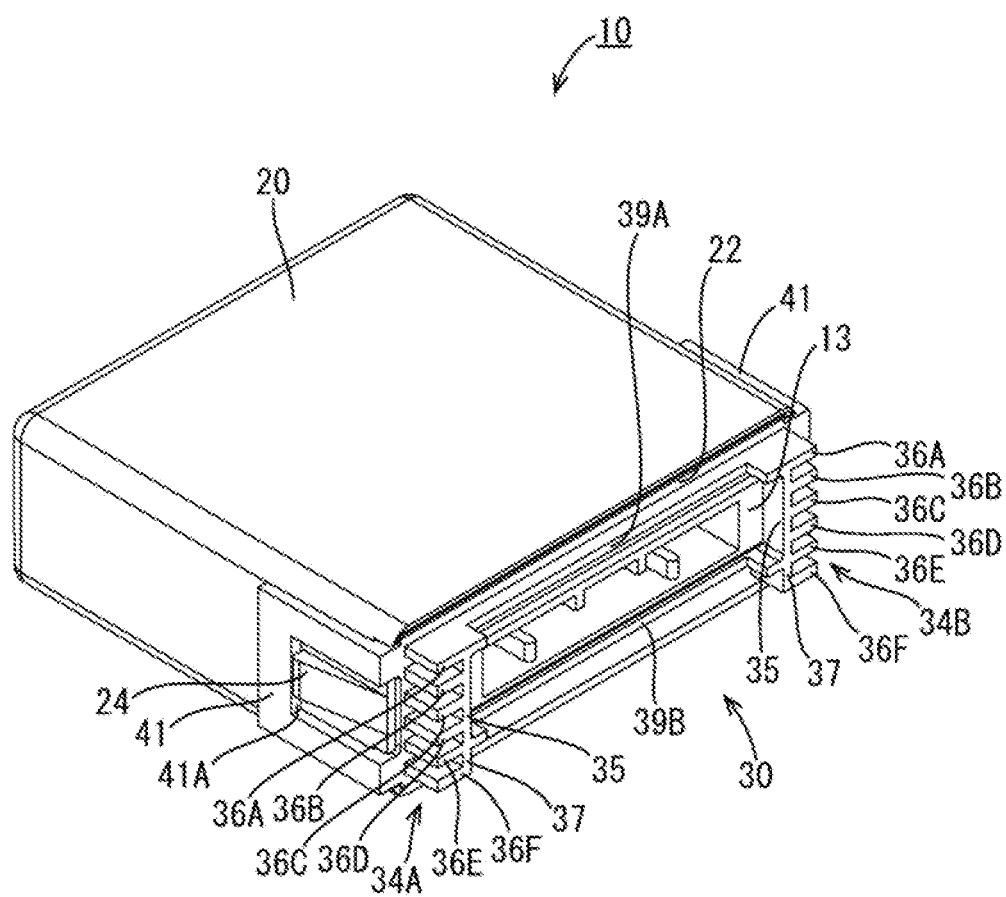
FIG. 1 is a perspective view showing an electrical junction box according to an embodiment.

As shown in FIG. 1, each of the locked portions 41 has a frame shape in which an engaged hole 41A is formed in a penetrating manner, and the cover 30 is restricted from coming off due to the lock protruding portions 24 being locked to the hole edges of the locked portions 41. These locked portions 41 can warp and be deformed. When the cover 30 is attached, the locked portions 41 abut against the lock protruding portions 24 and elastically expand, and, upon the lock protruding portions 24 reaching the inside of the locked hole 41A, the locked portions 41 are elastically restored and are locked to the lock protruding portions 24.

Assembly of the electrical junction box 10 will now be described.

Figure 8:
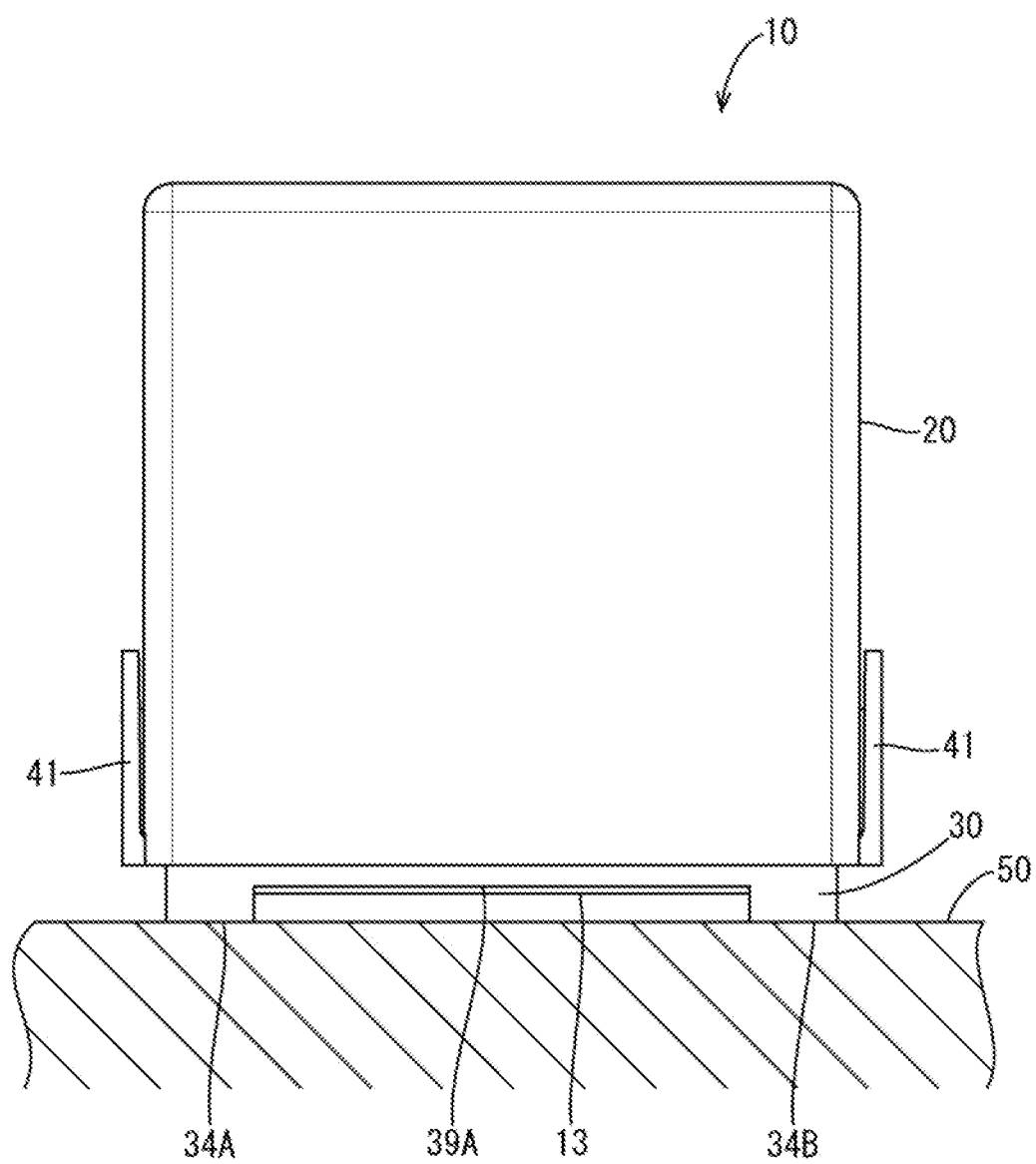
FIG. 8 shows a state of transporting the electrical junction box.

The connector 13 is mounted on the surface of the substrate 11 by means of reflow soldering, for example. Then, the substrate 11 is placed in the case 20 from the opening 22 of the case 20, as shown in FIG. 7. Next, when the connector 13 is inserted in the insertion hole 32 in the cover 30, the operator presses, with fingers, flat leading end faces of the protruding portions 34A and 34B downward to attach the cover 30 to the case 20. Then, the locked portions 41 are elastically deformed, and thereafter, the hole edges of the engaged holes 41A are locked to the lock protruding portions 24, and thus, the electrical junction box 10 is formed. The electrical junction box 10, when transported, is arranged with the cover 30 located at a lower end, as shown in FIG. 8, and is placed on a bottom surface portion 50 of a transportation case, for example. At this time, as a result of the flat faces of the protruding portions 34A and 34B being placed on a flat surface of the bottom surface portion 50, the electrical junction box 10 is kept in an upright orientation, and the leading end of the connector is arranged at a position spaced apart from the bottom surface portion 50. Accordingly, the connector 13 is unlikely to be affected by vibrations or the like during transportation.

The present embodiment exhibits the following effects.

The electrical junction box 10 includes the substrate 11 with the connector 13 attached thereto, a case 20 in which an opening portion 22 is formed and the substrate 11 is accommodated, and a cover 30 that is attached to the opening portion 22, and in which the insertion hole 32, into which the connector 13 is inserted, is formed in a penetrating manner. The cover 30 includes protruding portions 34A and 34B at positions on both sides of the connector 13, the protruding portions 34A and 34B protruding forward of a leading end of the connector 13.

According to the present embodiment, since the cover 30 includes the protruding portions 34A and 34B, which protrude forward of the leading end of the connector 13, on both sides of the connector 13, these protruding portions 34A and 34B can suppress the influence of external stress exerted on the connector 13. Accordingly, a failure occurring due to the connector 13 being subjected to external stress can be suppressed.

The hole edge of the insertion hole 32 has a rectangular shape having a pair of short portions 32A that oppose each other, and a pair of long portions 32B that are longer than the short portions 32A and oppose each other, and each of the protruding portions 34A and 34B is provided on a short portion 32A side.

This configuration makes it possible to keep the protruding portions 34A and 34B from obstructing fitting to the counterpart connector CN, compared with a configuration in which each of the protruding portions 34A and 34B is provided on a long portion 32B side.

The cover 30 includes the locked portions 41 that are locked to the case 20 when the cover 30 is attached to the case 20, in which the substrate 11 is accommodated, in a direction in which the connector 13 is inserted into the insertion hole 32. Each of the protruding portions 34A and 34B include a wall portion 35 extending along the hole edge of the insertion hole 32, and the ribs 36A to 36F extending in a direction intersecting the direction in which the wall portion 35 extends.

This configuration makes it possible to increase the area of the protruding portions 34A and 34B, which are to be pressed by an operator when attaching the cover 30 to the case 20, by an amount that corresponds to the area of the ribs 36A to 36F. Thus, operability can be increased when attaching the cover 30 to the case 20.

The ribs 36A to 36F have the extending portions 37, which extend in a direction parallel to the short portions 32A.

This configuration makes it possible to increase the area of the protruding portions 34A and 34B on the short portion 32A sides on which the area where the protruding portions 34A and 34B can be provided is small, and thus, an operation to attach the cover 30 can be readily performed.

The cover 30 is provided with the reinforcing walls 39A and 39B, which extend along the long portions 32B, and the reinforcing walls 39A and 39B have a height that keeps the reinforcing walls 39A and 39B from protruding forward of the leading end of the connector 13.

This configuration can keep, on the long portion 32B side of the cover 30, the reinforcing walls 39A and 39B from obstructing fitting to the counterpart connector CN, while reinforcing the long portion 32B side of the cover 30, by making the height of the reinforcing walls 39A and 39B smaller than the height of the connector 13.

Other Embodiments

The technique described in the present specification is not limited to the embodiment described with the above description and drawings, and for example, the following embodiments are also encompassed within the technical scope of the technique described in the present specification. (1) Although each of the protruding portions 34A and 34B is provided on a short portion 32A side of the cover 30, this may not be the case, and each the protruding portions 34A and 34B may alternatively be provided on a long portion 32B side of the cover 30. Also, the protruding portions may be provided over the entire periphery of the hole edge of the insertion hole 32.

Although the extending portions 37 are provided in the protruding portions 34A and 34B, the protruding portions 37 do not need to be provided.

Although the ribs 36A to 36F are configured to extend in a direction perpendicular to the direction in which the wall portions 35 extend, this may not be the case, and the ribs 36A to 36F may alternatively be configured to extend in a direction other than the direction perpendicular to the direction in which the wall portions 35 extend (i.e. extend in a direction intersecting the direction in which the wall portions 35 extend).

What is claimed is:

1. An electrical junction box comprising:
a substrate with a connector attached thereto, the connector having a hood disposed on a front of the connector;
a case in which an opening portion is formed and the substrate is accommodated; and
a cover that is attached to the opening portion, the cover having a pair of side walls, a top wall and a bottom wall spaced apart from each other so as to define an insertion hole configured to receive the hood of the connector and into which the hood of the connector is inserted,
wherein the cover includes a pair of protruding portions and a pair of a reinforcing walls, each of the pair of reinforcing walls is disposed along of an outer surface of a respective top wall and bottom wall, the pair of protruding portions is disposed on an outer surface of a front portion of the cover, the pair of protruding portions being spaced apart from each other and disposed on a respective one of the pair of side walls of the connector, the protruding portions protruding forward of a leading end of the pair of reinforcing walls and also protruding forward of a leading end of the hood of the connector, the pair of reinforcing walls recessed with respect to the leading end of the hood of the connector; and
wherein each of the protruding portions includes a wall portion extending along the hole edge of the insertion hole, and a rib extending in a direction orthogonal to the wall portion.

2. The electrical junction box according to claim 1,
wherein a hole edge of the insertion hole has a pair of short portions that oppose each other, and a pair of long portions that are longer than the short portions and oppose each other, and each of the protruding portions is provided on a short portion side.

3. The electrical junction box according to claim 2, wherein the cover includes a locked portion that is locked to the case when the cover is attached to the case, in which the substrate is accommodated, in a direction in which the connector is inserted into the insertion hole.

4. The electrical junction box according to claim 3, wherein the rib has an extending portion extending in a direction parallel to the short portions.

* * * * *